(12) United States Patent
Fukaishi et al.

(10) Patent No.: US 8,477,855 B2
(45) Date of Patent: Jul. 2, 2013

(54) SIGNAL TRANSMISSION SYSTEM AND SEMICONDUCTOR INTEGRATED CIRCUIT DEVICE

(75) Inventors: Muneo Fukaishi, Tokyo (JP); Yoshihiro Nakagawa, Tokyo (JP); Tadahiro Kuroda, Yokohama (JP)

(73) Assignees: NEC Corporation, Tokyo (JP); Keio University, Tokyo (JP)

( * ) Notice: Subject to any disclaimer, the term of this patent is extended or adjusted under 35 U.S.C. 154(b) by 889 days.

(21) Appl. No.: 12/162,687

(22) PCT Filed: Jan. 17, 2007

(86) PCT No.: PCT/JP2007/050558
§ 371 (c)(1),
(2), (4) Date: Jul. 30, 2008

(87) PCT Pub. No.: WO2007/086285
PCT Pub. Date: Aug. 2, 2007

(65) Prior Publication Data
US 2009/0196388 A1  Aug. 6, 2009

(30) Foreign Application Priority Data
Jan. 30, 2006  (JP) .................................. 2006-020762

(51) Int. Cl.
*H04L 7/02* (2006.01)
*H04B 5/00* (2006.01)

(52) U.S. Cl.
USPC ........... 375/258; 375/295; 375/316; 455/333; 257/93

(58) Field of Classification Search
USPC .... 375/258; 433/333, 338, 292, 41.1; 257/93, 257/777
See application file for complete search history.

(56) References Cited

U.S. PATENT DOCUMENTS

| | | | |
|---|---|---|---|
| 5,701,037 A * | 12/1997 | Weber et al. .................. | 257/777 |
| 7,447,492 B2 * | 11/2008 | Dupuis ......................... | 455/333 |
| 2007/0289772 A1 | 12/2007 | Kuroda et al. | |

FOREIGN PATENT DOCUMENTS

| | | |
|---|---|---|
| JP | 4196263 | 7/1992 |
| JP | 05-120499 A | 5/1993 |
| JP | 08-236696 A | 9/1996 |
| JP | 2000-354073 A | 12/2000 |
| JP | 200226283 | 1/2002 |
| JP | 2005-228981 A | 8/2005 |
| JP | 2005228981 | 8/2005 |

OTHER PUBLICATIONS

Mizoguchi, Daisuke, et al.; "A 1.2Gb/s/pin Wireless Superconnect Based on Inductive Inter-Chip Signaling (IIS);" 2004 IEEE International Solid-State Circuits Conference; Digest of Technical Papers; pp. 142-143 and p. 517. (2004).*

(Continued)

*Primary Examiner* — Shuwang Liu
*Assistant Examiner* — Ross Varndell
(74) *Attorney, Agent, or Firm* — Sughrue Mion, PLLC

(57) ABSTRACT

Disclosed is a semiconductor integrated circuit device including a transmitting circuit and a receiving coil inductively coupled to a transmitting coil. The transmitting circuit transmits data by supplying a current through the transmitting coil not at the time of transition of data but at every rising edge or falling edge of a clock used in transmission of data. At every rising edge or falling edge of the clock, a receiving circuit captures a voltage induced in the receiving coil due to the current flowing through the transmitting coil, reproduces the transmitted data and outputs the reproduced data.

10 Claims, 15 Drawing Sheets

OTHER PUBLICATIONS

K. Takahashi et al, "Current Status of Research and Development for Three-Dimensional Chip Stack Technology", Japanese Journal of Applied Physics vol. 40, 2001, pp. 3032-3037.

K. Kanda et al., "1.27Gb/s/pin 3mW/pin Wireless Superconnect (WSC) Interface Scheme", 2003 IEEE International Solid-State Circuits Conference, pp. 1-10.

D. Mizoguchi et al., A 1.2Gb/s/pin Wireless Superconnect Based on Inductive Inter-Chip Signaling (IIS), 2004 IEEE International Solid-State Circuits Conference, pp. 1-10.

N. Miura et al., "1Tb/s3W Inductive Coupling Transceiver for Inter-Chip Clock Data Transceiver", IEICE Technical Report, vol. 106, No. 206, May 18, 2006, '2.1 Bi-Phase Hencho Data Sojushinki', Fig. 5.

D. Mizoguchi et al., "Design of transceiver circuits for NRZ signaling in inductive inter-chip wireless superconnect", International Conference on Integrated Circuit Design and Technology 2005, May 9, 2005, pp. 59-62.

* cited by examiner

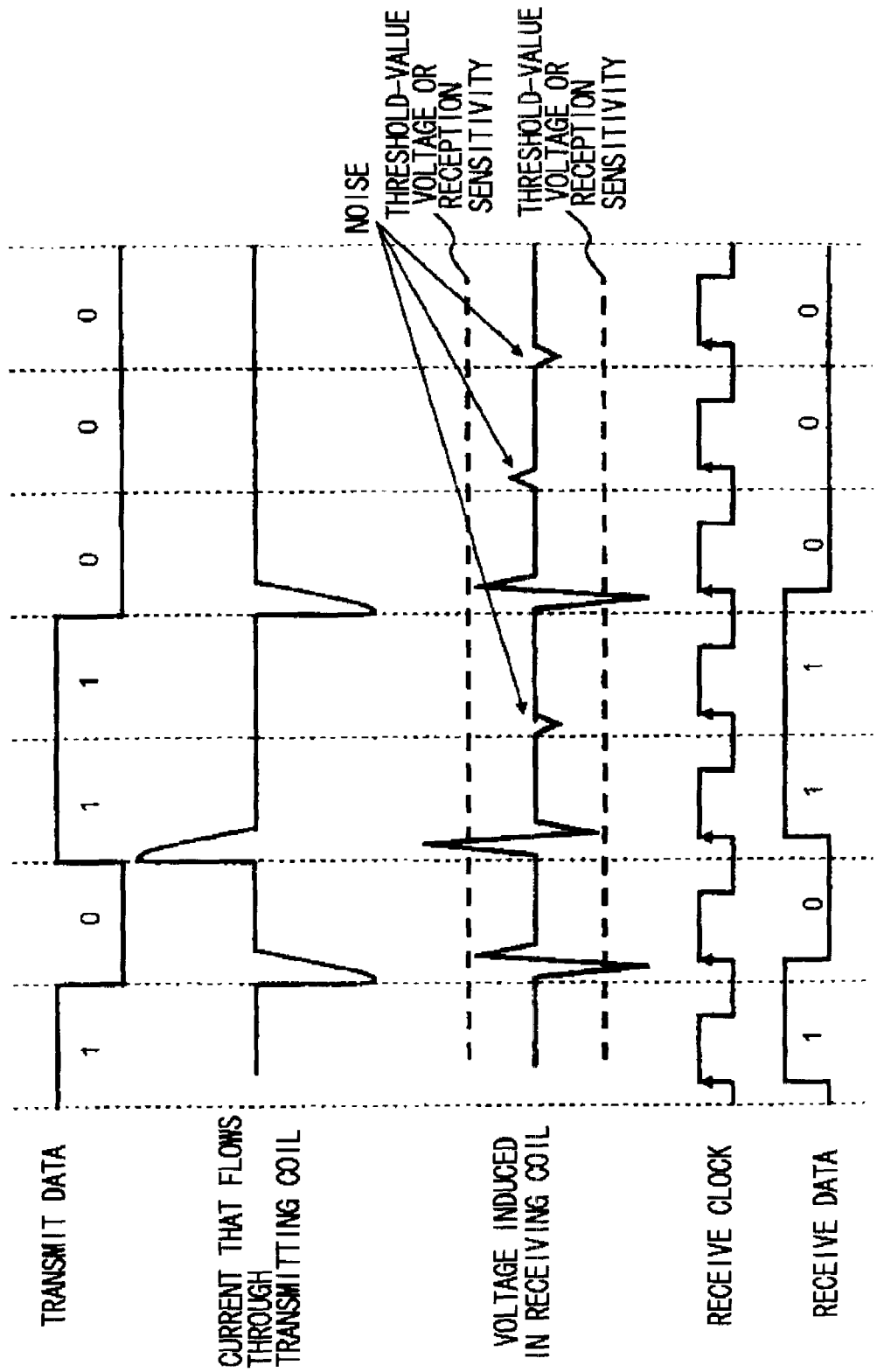

SIGNAL TRANSMISSION SYSTEM AND SEMICONDUCTOR INTEGRATED CIRCUIT DEVICE

TECHNICAL FIELD

This invention relates to a signal transmission system for transmitting data among a plurality of semiconductor chips and to a semiconductor integrated circuit device equipped with this system.

BACKGROUND ART

The integration density of semiconductor integrated circuit devices has been improved with the microfabrication of transistor elements and these devices are now capable of implementing multiple functions with a single semiconductor chip. Further, the microfabrication of transistor elements has been accompanied by progress in increasing the storage capacity of semiconductor memories, regardless of the type thereof, such as a DRAM (Dynamic Random-Access Memory) or SRAM (Static Random-Access Memory).

However, functions and memory capacity that exceed even the increases in multiple functions and memory capacity obtained by microfabrication of transistor elements are sought in recent semiconductor integrated circuit devices, and the microfabrication of transistor elements is approaching its limit. For these reasons, a new technology for elevating integration density further and raising functionality and memory capacity are now being sought. A stacked semiconductor device, or so-called three-dimensional semiconductor device, obtained by stacking a plurality of semiconductor chips is available as one such technology.

For instance, an arrangement in which a memory circuit is mounted on a parent chip that includes a CPU is described in Patent Document 1 as an example of implementation of a large-scale integrated circuit device without a change in chip area.

Further, a multilayer memory structure in which memory capacity is enlarged by adopting multiple layers of a memory cell array is described in Patent Document 2 as another example of implementation of a large-scale integrated circuit device without a change in chip area.

In a case where a plurality of semiconductor chips are stacked, inter-chip wiring for connecting the semiconductor chips to one another is required in addition to the wiring in the semiconductor chip surface. Although wire bonding usually is employed in inter-chip wiring, wire bonding is for interconnecting pads arranged on the semiconductor chip surface. In order to assure pad area (e.g., 100 µm square), therefore, a problem which arises is that a limitation is imposed upon the number of wires. Further, in a case where a plurality of semiconductor chips are stacked, pads are provided near the periphery of respective ones of the semiconductor chips in order to interconnect the semiconductor chips. Consequently, a problem which arises is that semiconductor chips of the same shape cannot be stacked. In particular, even if, when the number of usable wires is limited, it is attempted to provide a greater number of functions or enlarge memory capacity by stacking a plurality of semiconductor chips, the amount of data and number of signals transmitted between semiconductor chips increase to the extent of the increase in multiple functions and memory capacity. This is a factor that limits an improvement in performance.

Broadly speaking, there are two signal transmission techniques being considered as methods of solving these problems.

The first technique interconnects stacked semiconductor chips using through-wiring that passes through the semiconductor chips. For instance, Non-Patent Document 1 describes an example in which through-wiring for inter-chip wiring is formed by thinning a semiconductor substrate to 50 µm, providing a 10-µm-square hole and filling the hole with metal. Chip-to-chip wires can be laid out two-dimensionally in the chip surface by using this through-wiring, and several hundred chip-to-chip wires are possible. Furthermore, since the inter-chip wiring passes through the semiconductor chips, it is also possible to stack semiconductor chips of the same shape.

The second technique uses a non-contact interface in the transmission of data among a plurality of semiconductor chips. Broadly speaking, non-contact interfaces are of the capacitance-coupled type relying upon capacitance and inductance-coupled type using inductance. For instance, Non-Patent Document 2 describes a method and circuit in which pads are arranged on a semiconductor chip at intervals of 40 µm, two semiconductor chips are stacked with their surfaces face to face to thereby capacitively couple the pads, and data is transmitted using the capacitively coupled portions. Further, Non-Patent Document 3 describes a method and circuit in which coils each comprising a spiral inductor are arranged at intervals of 100 µm in a wiring area on a semiconductor chip, a plurality of the semiconductor chips are stacked with their surfaces in the same direction to thereby inductively couple the coils, and data is transmitted using the inductively coupled portions.

If signal transmission among a plurality of semiconductor chips is made possible using such through-wiring and capacitive or inductive coupling, the number of signals capable of being transmitted among semiconductor chips can be increased in comparison with an arrangement in which semiconductor chips are interconnected using wire bonding, and it becomes possible to stack not only memory chips but also semiconductor chips on which logic circuits or analog circuits, etc., have been formed. As a result, a semiconductor integrated circuit device can be provided with more functions and a larger memory capacity while the stacking of a plurality of semiconductor chips is made possible.

However, the technique for transmitting signals among stacked semiconductor chips using through-wiring requires a step of forming a hole referred to as a "through-via" that connects the top and bottom of the semiconductor substrate in order to perform signal transmission and filling the through-via with an electrically conductive material such as metal to thereby form wiring, and a step of encapsulation in an insulating material in order to insulate the through-wiring and semiconductor substrate. A problem which arises is that the process for manufacturing the semiconductor integrated circuit device is complicated, thereby raising manufacturing cost and prolonging manufacturing time.

Further, the technique for transmitting signals among stacked semiconductor chips using capacitive coupling is such that pads formed on the surfaces of the semiconductor chips must be arranged so as to face each other. This means that the number of layers of stacked semiconductor chips is limited to two, and it is difficult to stack the chips in three or more layers. A problem which arises is that a limitation is imposed upon an increase in number of functions and enlargement of memory capacity.

By contrast, the technique for transmitting signals among stacked semiconductor chips using inductive coupling, unlike capacitive coupling, is such that even if a semiconductor substrate exists between inductively coupled coils, the magnetic fields produced by the coils punch through the semiconductor substrate and, hence, it is possible to stack semiconductor chips in three or more layers. Accordingly, the functionality and memory capacity of a semiconductor integrated circuit device are increased while the stacking of semiconductor chips in three or more layers is made possible. Hence a signal transmission system using inductive coupling in inter-chip wiring is promising.

A signal transmission system that uses such inductive coupling will be described in detail with reference to FIGS. 11 to 13.

It is required in a signal transmission system using inductive coupling to provide a transmitting circuit on a data-transmit side including a transmitting coil and a driver for supplying a current corresponding to transmit data through the transmitting coil, and a receiving circuit on a data-receive side including a receiving coil, which is inductively coupled to the transmitting coil, and a circuit for reproducing data from the output current of the receiving coil.

FIG. 11 is a circuit diagram illustrating the configuration of a transmitting circuit used by a conventional signal transmission system, and FIG. 12 is a circuit diagram illustrating the configuration of a receiving circuit used by a conventional signal transmission system. Further, FIG. 13 is a timing chart illustrating the manner in which data is transmitted using the transmitting circuit shown in FIG. 11 and the receiving circuit shown in FIG. 12.

As illustrated in FIG. 11, the conventional transmitting circuit has a transmitting coil 100, a first driver circuit 101 and a second driver circuit 102 for supplying current through the transmitting coil 100 in a direction that corresponds to a change in transmit data, and a delay element 103 for delaying the transmit data supplied to the second driver circuit 102.

As illustrated in FIG. 12, the conventional receiving circuit has a receiving coil 300, a first resistor 301 and a second resistor 302 for converting current that flows into the receiving coil 300 to a voltage, and a receive-data reproducing circuit 303 for capturing a voltage, which is induced in the receiving coil 302 in response to the flow of current into the transmitting coil 100, at every rising or falling edge of a receive clock, reproducing the transmitted data (receive data) and outputting the reproduced data.

With inductive coupling it is well known that when the direction of current that flows into one coil changes, an induced current flows into the other coil coupled thereto. Consequently, if current is passed through the transmitting coil 100 when there is no change in the transmit data, power is consumed wastefully. Accordingly, the conventional transmitting circuit shown in FIG. 11 is such that only at the timing at which there is a change in the transmit data is current passed through the transmitting coil 100 in the direction corresponding to this change, as illustrated in FIG. 13. For example, a current is passed through the transmitting coil 100 in the negative direction in a case where transmit data changes from "1" to "0" and a current is passed through the transmitting coil 100 in the positive direction in a case where transmit data changes from "0" to "1". The delay element 103 delays the transmit data supplied to either the first driver circuit 101 or second driver circuit 102 (the second driver circuit 102 in FIG. 11), thereby deciding the time (pulse width) over which current is passed through the transmitting coil 100.

When current is passed through the transmitting coil 100, an induced current flows into the receiving coil 300 and a voltage (referred to as an "induced voltage" below) is produced across the first resistor 301 and second resistor 302. The receive-data reproducing circuit 303 has, e.g., a switch circuit turned on and off by the receive clock, and a latch circuit that latches the output voltage of the switch circuit. The induced voltage produced across the first resistor 301 and second resistor 302 is captured using the switch circuit at every rising edge (or falling edge) of the receive clock, and the transmitted data (receive data) is reproduced based upon the polarity ("1" or "0") of the induced voltage.

Patent Document 1

JP Patent Kokai Publication No. JP-A-4-196263

Patent Document 2

JP Patent Kokai Publication No. JP-P2002-26283A

Non-Patent Document 1

K. Takahashi et al., "Current Status of Research and Development for Three-Dimensional Chip Stack Technology", Japanese Journal of Applied Physics, Vol. 40 (2001), pp. 3032-3037

Non-Patent Document 2

K. Kanda, et al., "1.27 Gb/s/pin 3 mW/pin Wireless Superconnect (WSC) Interface Scheme", 2003 IEEE International Solid State Circuits Conference, SESSION 10/HIGH SPEED BUILDING BLOCKS/PAPER 10.7

Non-Patent Document 3

D. Mizoguchi, et al., "A 1.27 Gb/s/pin Wireless Superconnect Based on Inductive Inter-Chip Signaling (IIS)", 2004 IEEE International Solid-State Circuits Conference, SESSION 7/TD: SCALING TRENDS/7.6

SUMMARY

The entire disclosures of Patent Documents 1 and 2 and Non-Patent Documents 1 to 3 are incorporated herein by reference thereto. The following analysis is given by the present invention.

As mentioned above, a signal transmission system using inductive coupling is effective in application to a stacked semiconductor device, or so-called three-dimensional semiconductor device, in which semiconductor chips are stacked in three or more layers.

However, the conventional signal transmission system is one in which data is sent and received using a transmitting coil and a receiving coil only at the timing at which transmit data changes, as illustrated in FIG. 13. Consequently, in a case where transmit data of successive "1"s or "0"s is transmitted, there is a higher possibility that the receiving circuit will malfunction owing to noise.

Examples of noise that enter the receiving circuit are disturbance noise that enters from outside the semiconductor integrated circuit device, noise that enters the transmitting coil from a logic circuit or transmitting circuit mounted on the semiconductor chip on the data-transmit side, and noise that enters the receiving coil from a logic circuit or receiving circuit mounted on the semiconductor chip on the data-receive side.

The manner in which the receiving circuit malfunctions owing to such noise is exemplified in FIG. 14.

When transmit data is a series of successive "1" or "0"s, the receiving circuit captures the induced voltage, which is produced across the first resistor and second resistor, at every rising edge (or falling edge) of the receive clock and reproduces receive data, as described above. If noise enters the receiving coil at the timing of the rising edge of the receive clock, as illustrated in FIG. 14, then the receiving circuit will output erroneous receive data.

FIG. 14 illustrates an example in which the receiving circuit inalfunctions because the timing at which noise enters coincides with the rising edge of the receive clock. If the timing at which noise enters deviates from the rising edge of the receive clock, however, noise will not be a cause of malfunction. Since the timing at which noise enters the receiving coil is uncertain, however, it is not possible to predict the timing at which noise will enter and to control the time of the rising edge of the receive signal so as not to coincide with this timing. Accordingly, malfunction due to noise cannot be prevented with a method of optimally setting or controlling transmission and reception timings of the receive clock. It should be noted that with the receiving circuit shown in FIG. 12, if the polarity of the noise that enters is the same as the polarity of the immediately preceding transmit data, malfunction due to noise will not occur even when the timing at which noise enters coincides with the rising edge of the receive clock. However, since the polarity of the noise and the polarity of the transmit data usually are independent of each other, malfunction due to noise cannot be prevented.

A method of improving a S/N ratio of an induced voltage produced by the receiving coil is conceivable as an technique for reducing malfunction of the receiving circuit due to the entry of noise described above. Further, a method of setting a threshold-value voltage in the receiving circuit and adjusting reception sensitivity so as to render insensible noise that has entered the receiving coil is conceivable.

FIG. 15 illustrates the manner in which data is transmitted by a transmitting circuit and receiving circuit that implement these measures.

In order to improve the S/N ratio of an induced voltage produced by the receiving coil, a method of increasing current that flows into the transmitting coil to thereby increase the induced voltage produced by the receiving coil is available. Further, in order to increase an induced voltage produced by the receiving coil, it will suffice to strengthen a coupling force between the transmitting and receiving coils. For example, there are a method of increasing the numbers of windings of the transmitting and receiving coils and a method of reducing the spacing between semiconductor chips, wherein the spacing is the data transmission distance.

FIG. 15 illustrates an example in which current that flows into the transmitting coil is increased to increase the induced voltage produced by the receiving coil and, moreover, a threshold-value voltage is set in the receiving circuit and reception sensitivity is adjusted so as to render noise insensible.

If a received signal (an induced voltage produced by the receiving coil) is made sufficiently larger than noise by the measures described above, the receiving circuit will not malfunction, as illustrated in FIG. 15. However, with the method of increasing the induced voltage of the receiving coil by increasing a current that flows into the transmitting coil, it is difficult to accurately ascertain the magnitude of noise that enters the receiving coil. Consequently, the induced voltage produced by the receiving coil is made larger than necessary and power is consumed wastefully by the semiconductor integrated circuit device.

Further, with the method of increasing the numbers of windings of the transmitting coil and receiving coil, the transmitting and receiving coils are increased in size and, hence, coil mounting area is enlarged. In addition, with the method of reducing the spacing between semiconductor chips, the semiconductor chips must be made thin. Consequently, the strength of the semiconductor chips declines, destruction occurs more easily at the time of manufacture of the semiconductor integrated circuit device and this is a cause of diminished product yield.

Furthermore, with the method of setting a threshold-value voltage in the receiving circuit in such manner that noise will not be sensed, it is necessary, for example, to measure an induced voltage produced by the receiving coil and a noise voltage and to set the threshold-value voltage. However, since it is difficult to accurately ascertain the magnitude of noise that enters the receiving coil, as mentioned above, it is difficult to set the threshold-value voltage optimally.

The present invention has been devised in order to solve the problems of the prior art as set forth above and its object is to provide a signal transmission system using inductive coupling that is capable of reducing malfunction due to noise, as well as a semiconductor integrated circuit device equipped with this system.

The above and other objects are attained by a signal transmission system according to the present invention, for transmitting data among a plurality of semiconductor chips using a transmitting coil and a receiving coil inductively coupled to the transmitting coil, the system comprising:

a transmitting circuit including the transmitting coil and a transmit-current generating unit for supplying a current through the transmitting coil at every rising edge or falling edge of a clock used in the transmission of the data; and a receiving circuit including the receiving coil and a receive-data reproducing circuit for capturing voltage, which has been induced in the receiving coil owing to passage of the current through the transmitting coil, at every rising edge or falling edge of the clock, reproducing data transmitted and outputting the reproduced data.

On other hand, a semiconductor integrated circuit device according to the present invention comprises:

a first semiconductor chip on which the above-described transmitting circuit has been mounted; and a second semiconductor chip stacked with the first semiconductor chip and on which the above-described receiving circuit has been mounted.

With the signal transmission system and semiconductor integrated circuit device constructed as set forth above, an induced voltage is produced by the receiving coil for each and every item of data transmitted. Even if noise enters the receiving coil, therefore, the receiving circuit is capable of capturing the correct data at every rising edge or falling edge of a receive clock. Accordingly, the apparent S/N ratio of the receiving circuit is improved and malfunction due to noise reduced.

Furthermore, since the S/N ratio is improved by the technique of capturing correct data for each and every item of data transmitted, the induced voltage produced by the receiving coil need not be made larger than necessary. As a result, the problems of increased power consumption, enlarged coil size and thinned semiconductor substrate do not arise.

A transmitting circuit according to the present invention is for performing data transmission with a receiving side using inductive coupling and includes a transmit-current generating circuit for adopting at least one edge of a rising edge or falling edge of a transmit clock for data transmission as an effective edge, and exercising control in such a manner that in response to the effective edge, a current including a direction in conformity with a value of transmit data corresponding to the effective edge is passed through a transmit inductor.

In the present invention, the transmit-current generating circuit includes: a pulse generating circuit to which the transmit clock is input for generating a pulse signal having a prescribed pulse width when the effective edge of the transmit clock is detected; a first driver circuit including first and second transistors connected between first and second power supplies, wherein a connection node of the first and second transistors is adopted as an output end and the output end is connected to one end of the transmit inductor; a second driver circuit including third and fourth transistors connected between the first and second power supplies, wherein a connection node of the third and fourth transistors is adopted as an output end and the output end is connected to the other end of the transmit inductor; and a logic circuit to which the transmit data and output of the pulse generating circuit are input and which supplies an output signal to control terminals of the first to fourth transistors for controlling on/off operation of the first to fourth transistors. When the transmit data is a first logic value, the logic circuit exercises control that turns on the first transistor, turns off the second and third transistors and turns on the fourth transistor only for a period of time over which a pulse is output from the pulse generating circuit and turns off the fourth transistor all other times. When the transmit data is a second logic value, the logic circuit exercises control that turns on the third transistor, turns off the first and fourth transistors and turns on the second transistor only for a period of time over which a pulse is output from the pulse generating circuit and turns off the second transistor at all other times.

In accordance with the present invention, data can be transmitted at a high S/N ratio without occurrence of problems of increased power consumption, enlarged coil size and thinned semiconductor substrate. Accordingly, a signal transmission system using inductive coupling capable of reducing malfunction due to noise is obtained, as well as a semiconductor integrated circuit device that uses this system.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 15 is a timing chart illustrating the manner of transmission of data after application of ordinary malfunction measures considered in the conventional signal transmission system.

Figure 1:
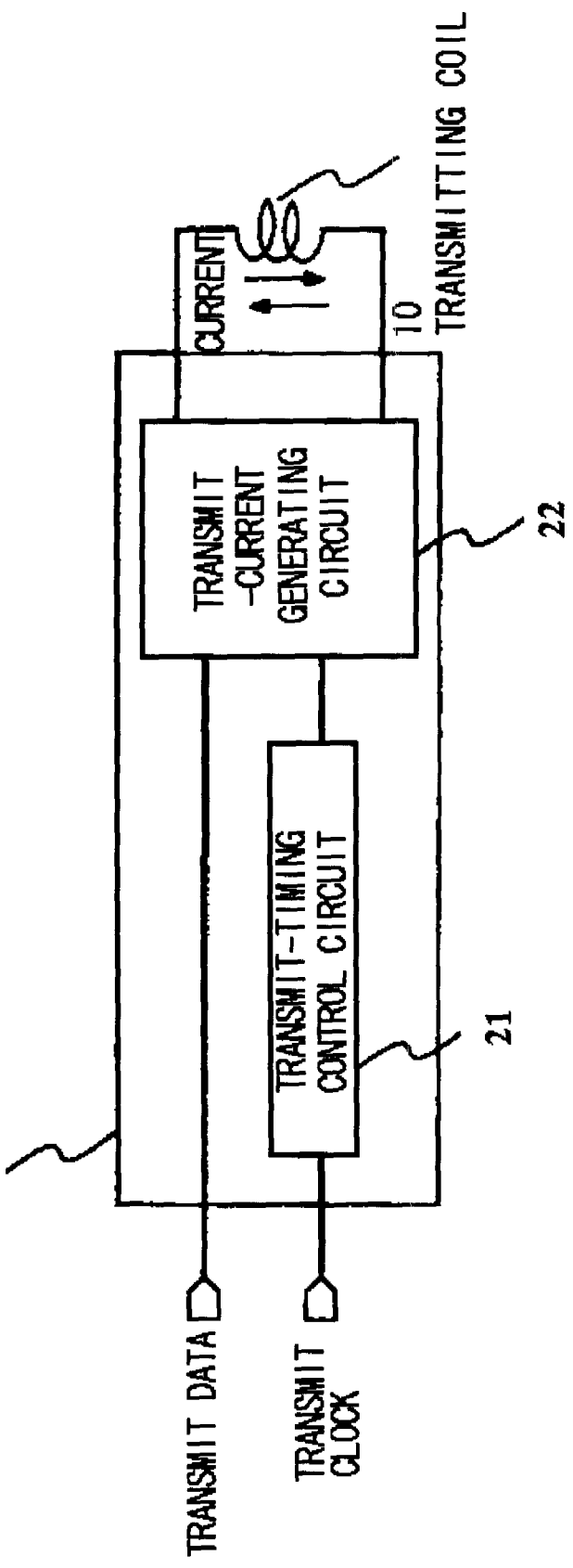
FIG. 1 is a block diagram illustrating an example of the configuration of a transmitting circuit used by a signal transmission system according to the present invention.

EXPLANATIONS OF SYMBOLS 10 transmitting coil
20 transmit-current generating unit
21 transmit-timing control circuit
22 transmit-current generating circuit
30 first semiconductor chip
31 transmitting circuit
40 second semiconductor chip
41 receiving coil
42 receiving circuit
211 minute-pulse generating circuit
221 first driver circuit
222 second driver circuit
223 logic circuit
224, 226 pMOS transistor
225, 227 nMOS transistor
2211, 2215, 2218 inverter
2212 variable delay circuit
2213 OR gate
2214 variable delay element
2216 switch
2217 capacitor
2219 variable current source 2219

PREFERRED MODES FOR CARRYING OUT THE INVENTION

Next, the present invention will be described with reference to the drawings.

FIG. 1 is a block diagram illustrating an example of the configuration of a transmitting circuit used by a signal transmission system according to the present invention.

As illustrated in FIG. 1, the transmitting circuit used by the signal transmission system of the present invention includes a transmitting coil 10 and a transmit-current generating unit 20 for supplying a current through the transmitting coil 10 at every rising edge or falling edge of a clock used in transmission of data. Transmit data and a clock (transmit clock) used in data transmission are supplied to the transmit-current generating unit 20.

The transmit-current generating unit 20 has the transmit-timing control circuit 21 and the transmit-current generating circuit 22. The transmit-timing control circuit 21 generates a timing signal that decides the timing at which current is passed through the transmitting coil 10. In synchronization with the timing signal that is output from the transmit-timing control circuit 21, the transmit-current generating circuit 22 supplies the transmitting coil 10 with a current in a direction that corresponds to the polarity of the transmit data.

Figure 11:
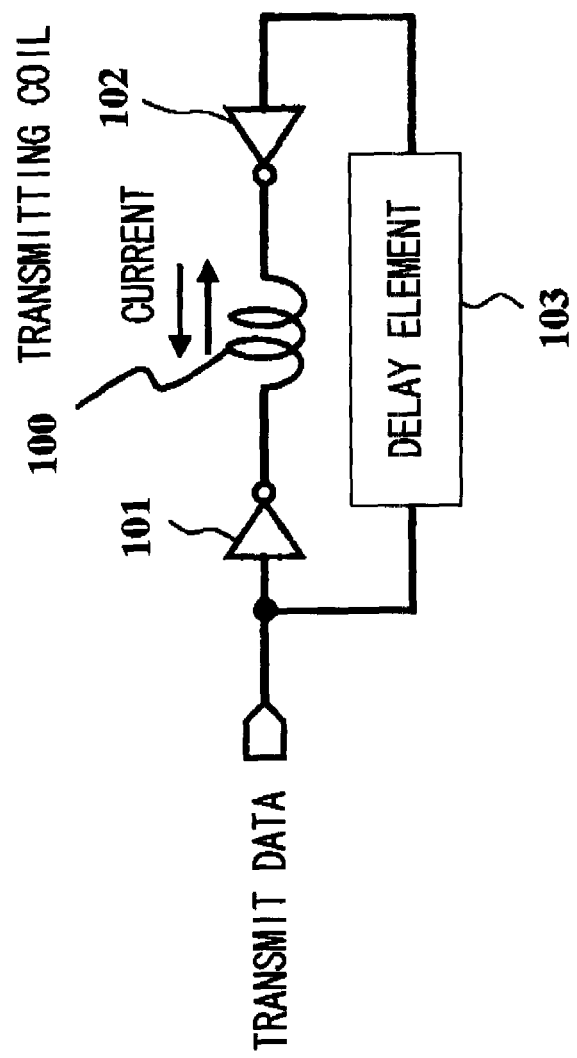
FIG. 11 is a circuit diagram illustrating the configuration of a transmitting circuit used by a conventional signal transmission system.

With the conventional transmitting circuit shown in FIG. 11, current in a direction corresponding to the polarity of the transmit data is passed through the transmitting coil only when the transmit data has changed, as set forth above. On the other hand, in the present invention, current in the direction corresponding to the polarity of the transmit data is passed through the transmitting coil 10 at all rising edges (or all falling edges) of the transmit clock. That is, current in the direction corresponding to the polarity of the transmit data is passed through the transmitting coil 10 not at the transition points of the transmit data but at every rising edge (or falling edge) of the transmit clock. For example, a current is passed through the transmitting coil 10 in the positive direction at the timing of the rising edge of the transmit clock if the transmit data is "1", and is passed through the transmitting coil 10 in the negative direction at the timing of the rising edge of the transmit clock if the transmit data is "0".

It should be noted that in the signal transmission system of the present invention, it is assumed that receive data is reproduced using a receiving circuit (see FIG. 12) similar to that of the prior art. Accordingly, a description of the configuration of the receiving circuit is omitted.

Figure 2:
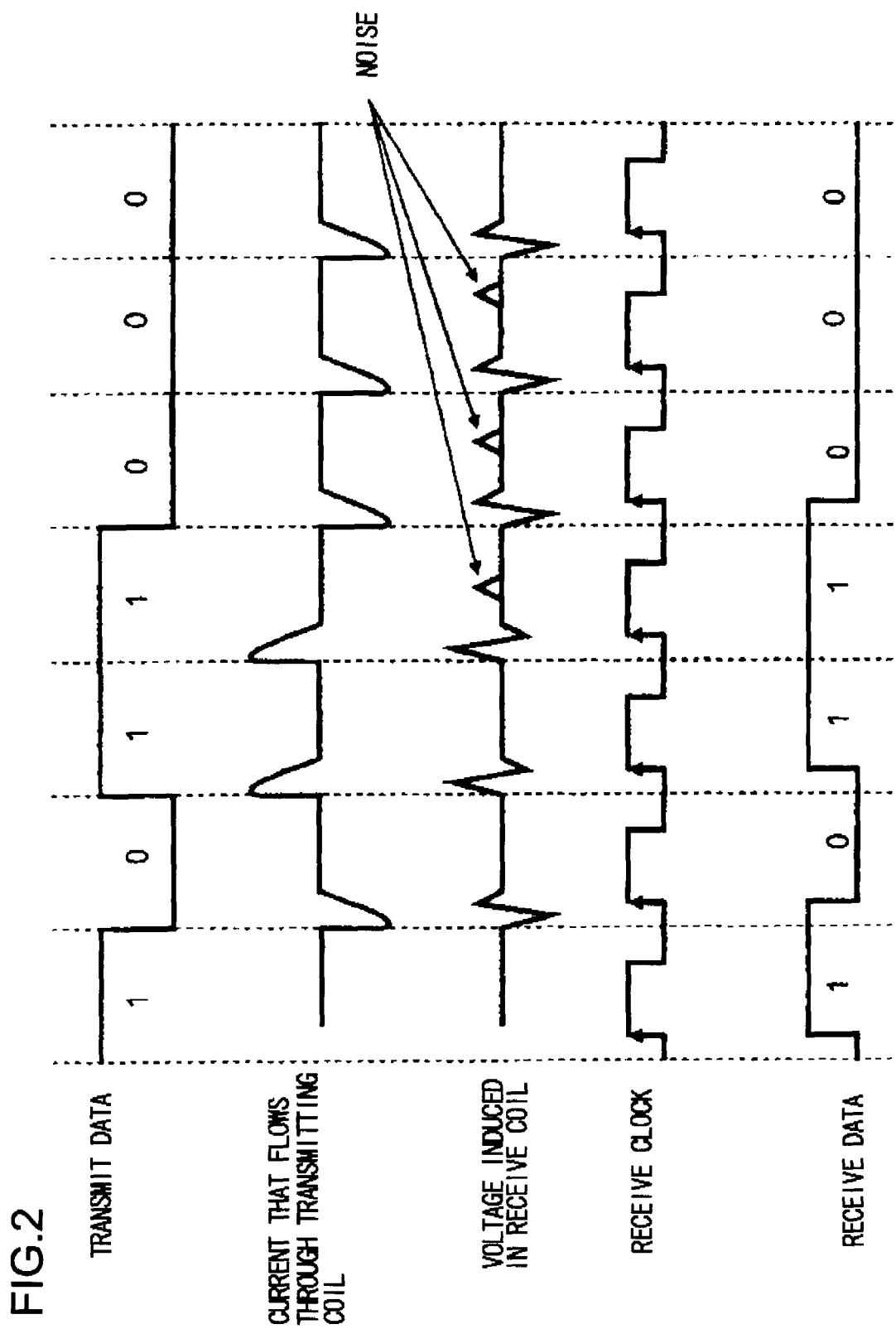
FIG. 2 is a timing chart illustrating the manner in which data is transmitted using a signal transmission system according to the present invention.

FIG. 2 is a timing chart illustrating the manner in which data is transmitted using a signal transmission system according to the present invention.

In the signal transmission system of the present invention, current in the direction corresponding to the polarity of the transmit data is passed through the transmitting coil 10 not at the transition points of the transmit data but at every rising edge of the transmit clock. Consequently, as illustrated in FIG. 2, even if the transmit data is a series of "1"s or "0"s in succession, the receiving coil generates an induced voltage corresponding to the polarity of the transmitted data at every rising edge (or falling edge) of the receive clock. The receiving circuit captures the induced voltage which is generated by the receiving coil, in the receive-data reproducing circuit at every rising edge (or falling edge) of the receive clock, thereby reproducing and outputting the transmitted data.

In accordance with the signal transmission system of the present invention, therefore, the receiving coil generates, for each and every item of transmitted data, a corresponding induced voltage. Consequently, even if noise enters the receiving coil, the receiving circuit is capable of capturing the correct data at every rising edge of the receive clock. As a result, the apparent S/N ratio of the receive data is improved and malfunction due to noise can be reduced.

Furthermore, since the S/N ratio is improved by capturing all transmitted data in the signal transmission system of the present invention, the induced voltage generated by the receiving coil need not be set to be larger than necessary. As a result, the problems of increased power consumption, enlarged coil size and destruction owing to thinning of the semiconductor substrate do not arise.

It should be noted that since current is passed through the transmitting coil 10 for every item of data transmitted in the signal transmission system of the present invention, there is the danger that power consumption will increase in comparison with the conventional transmitting circuit shown in FIG. 11. However, since the current per se that flows through the transmitting coil 10 is not increased, data can be transmitted with less power consumption in comparison with the aforesaid method of improving the S/N ratio by increasing the amount of current passed through the transmitting coil.

Figure 3:
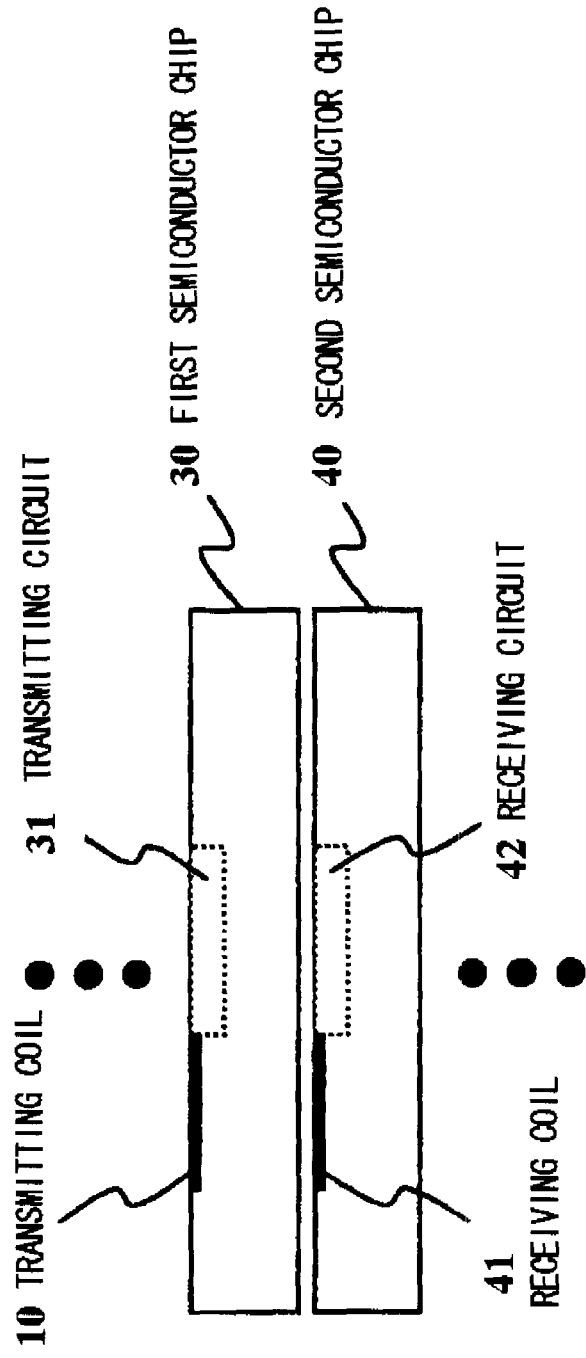
FIG. 3 is a side sectional view illustrating an example of the configuration of a semiconductor device integrated circuit device according to the present invention.

FIG. 3 is a side sectional view illustrating an example of the configuration of a semiconductor device integrated circuit device according to the present invention.

In FIG. 3, there is illustrated an example in which a transmitting circuit 31 that includes the transmitting coil 10 is mounted on a first semiconductor chip 30 and a receiving circuit 42 that includes a receiving coil 41 is mounted on the second semiconductor chip 40.

As illustrated in FIG. 3, in a semiconductor integrated circuit device to which the signal transmission system of the present invention is applied, the first semiconductor chip 30 and the second semiconductor chip 40 are stacked and the transmitting coil 10 and receiving coil 41 are formed at opposing positions so as to be inductively coupled. Although there is no particular limitation imposed, the transmitting coil 10 and receiving coil 41 are each constituted by a planar-type spiral inductors etc., on which a pattern of thin metal film (a gold layer) has been formed.

Figure 4:
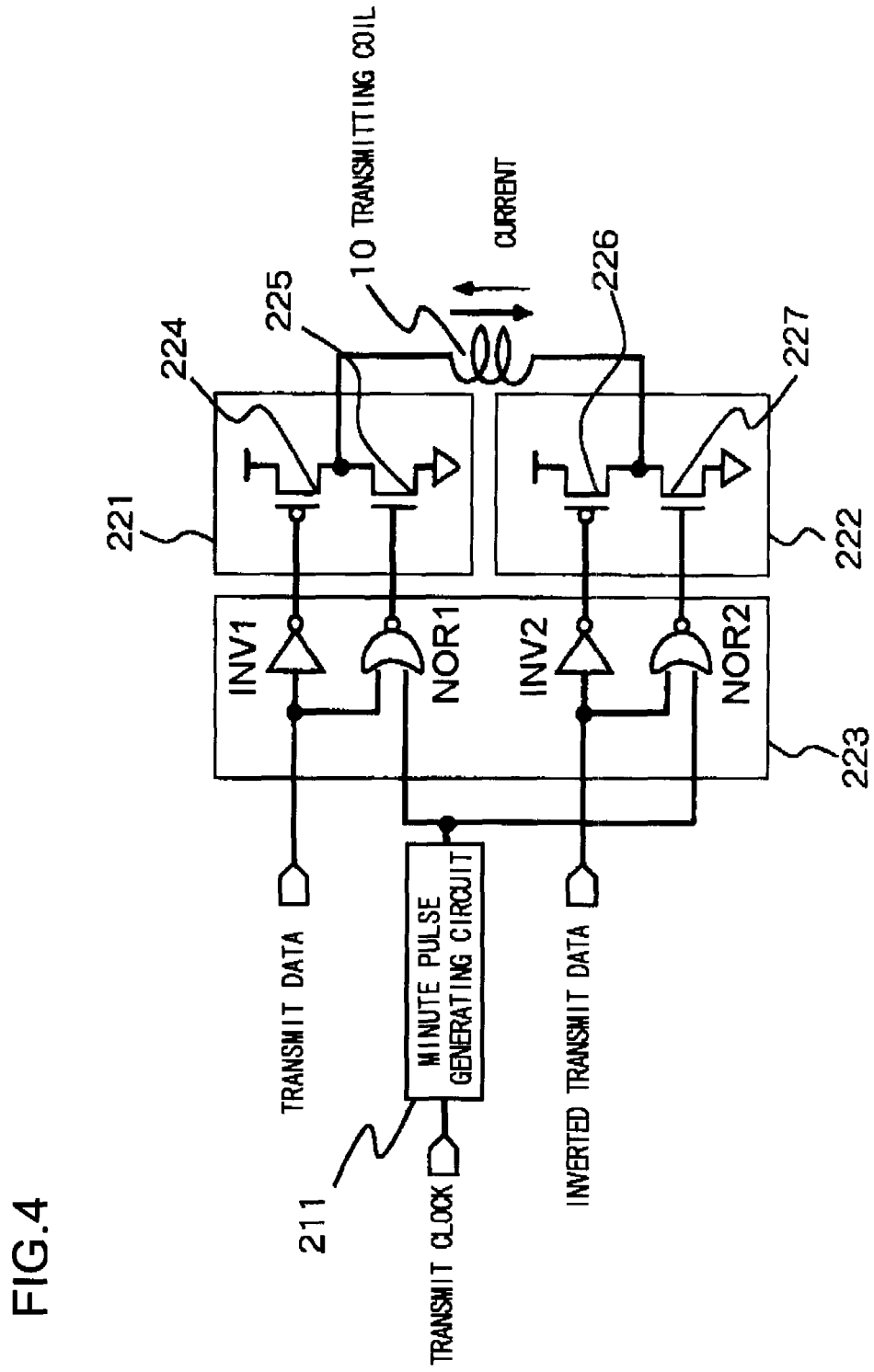
FIG. 4 is a circuit diagram illustrating a specific example of the transmitting circuit shown in FIG. 1.
Figure 5:
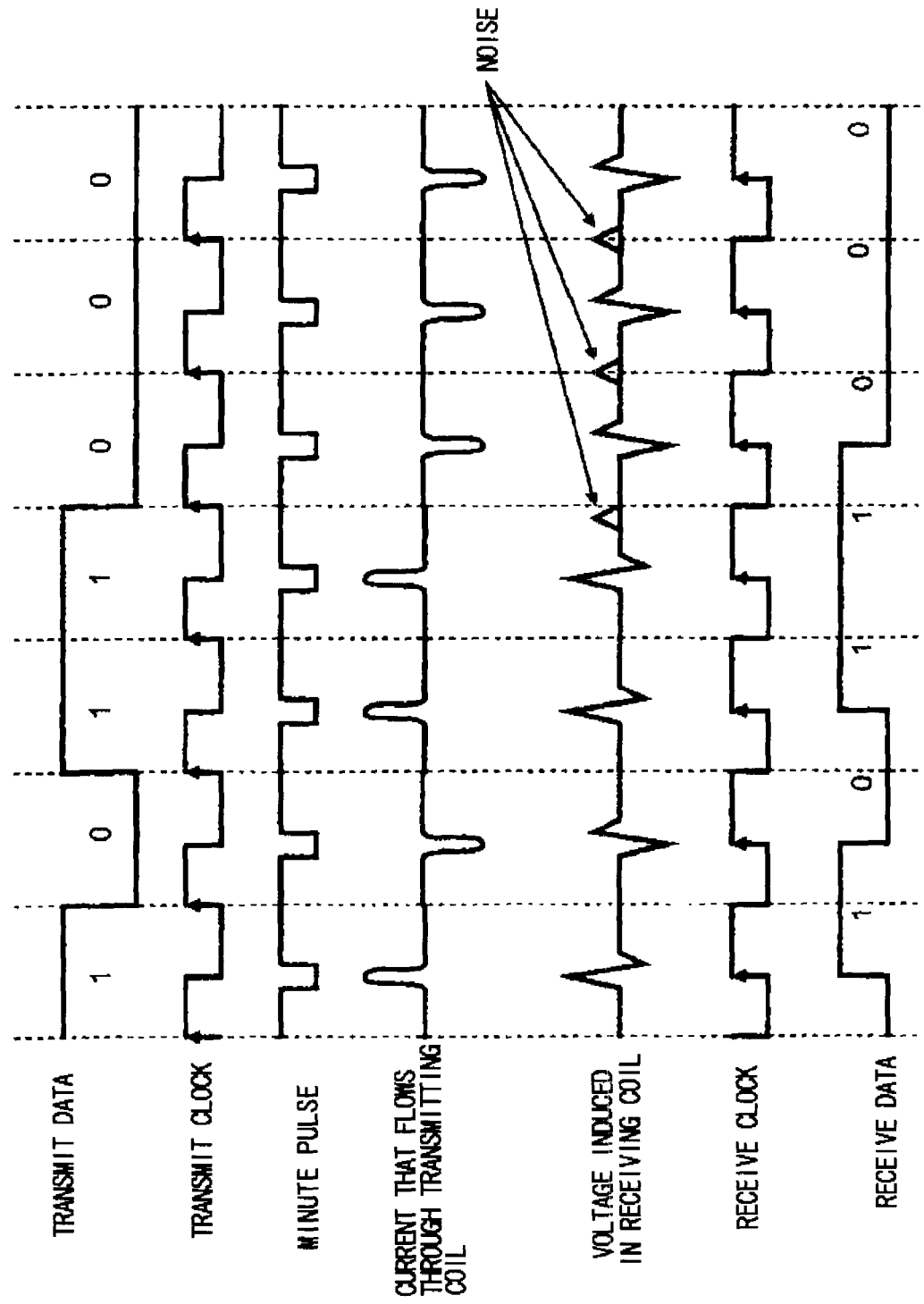
FIG. 5 is a timing chart illustrating the manner in which data is transmitted using the transmitting circuit shown in FIG. 4.
Figure 12:
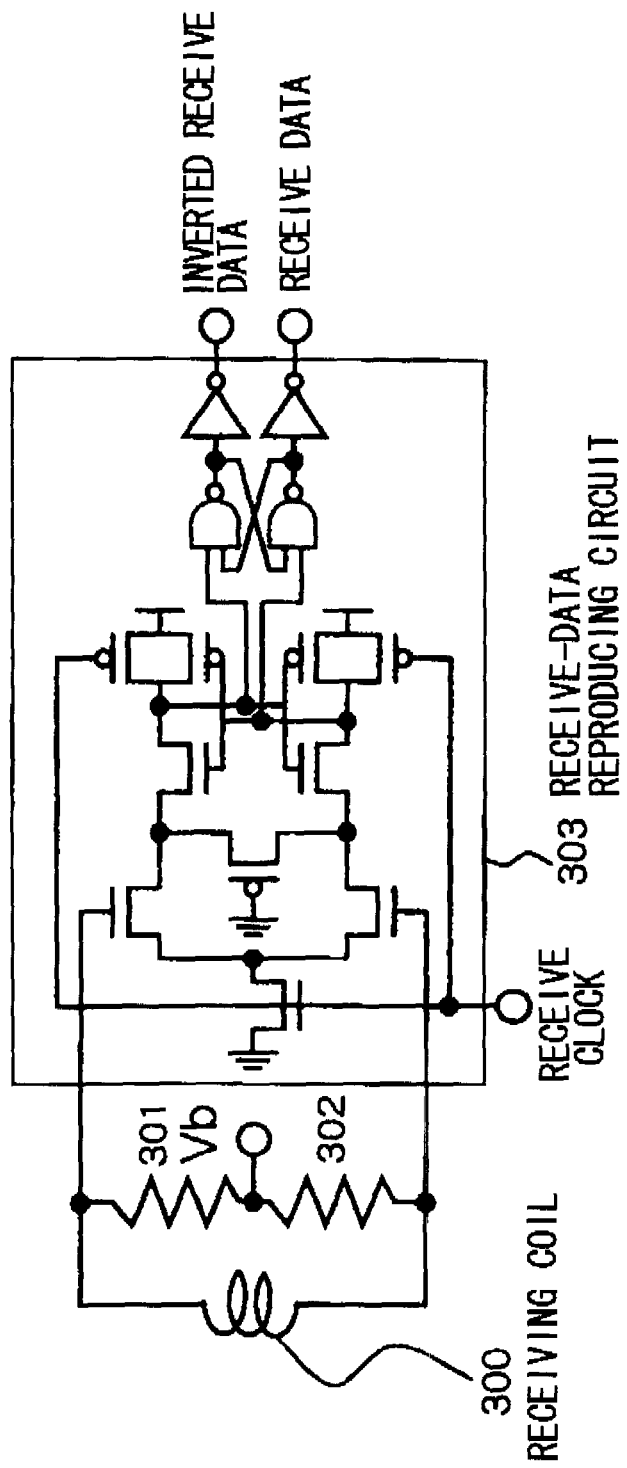
FIG. 12 is a circuit diagram illustrating the configuration of a receiving circuit used by a conventional signal transmission system.
Figure 13:
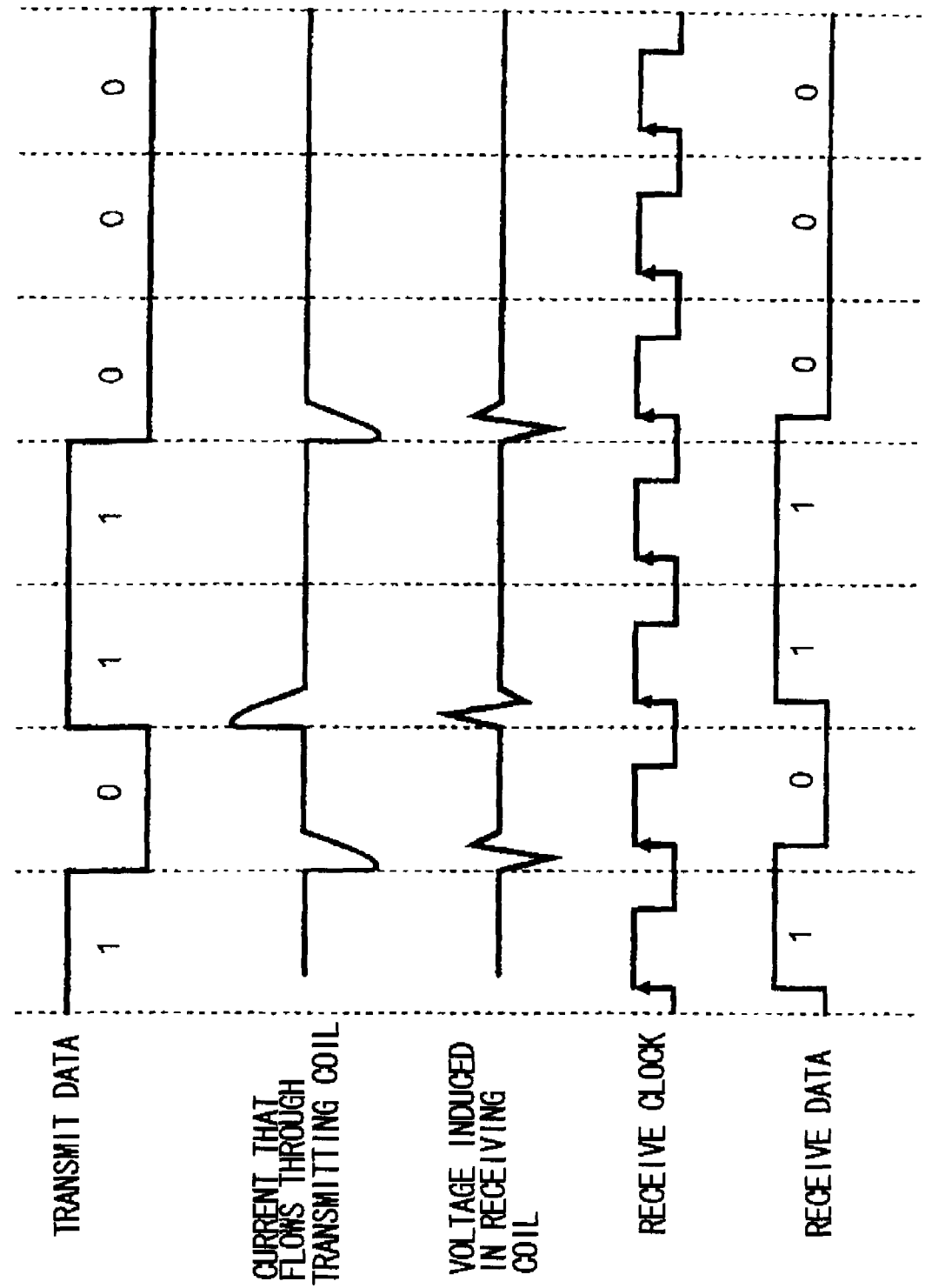
FIG. 13 is a timing chart illustrating the manner in which data is transmitted using the transmitting circuit shown in FIG. 11 and the receiving circuit shown in FIG. 12.
Figure 14:
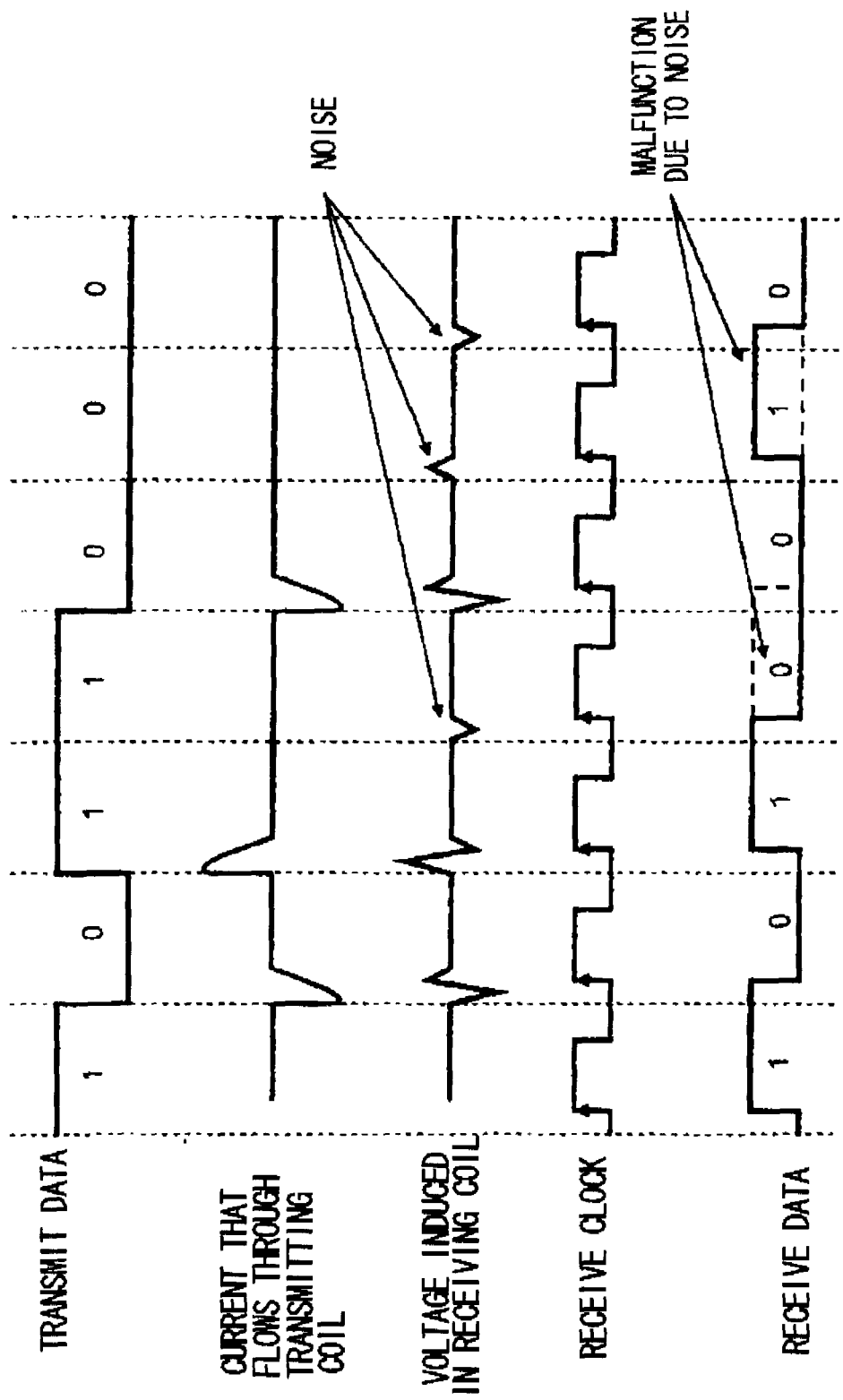
FIG. 14 is a timing chart illustrating the manner in which a receiving circuit malfunctions in the conventional signal transmission system.

FIG. 4 is a circuit diagram illustrating a specific example of the configuration of the transmitting circuit shown in FIG. 1, and FIG. 5 is a timing chart illustrating the manner in which data is transmitted using the transmitting circuit shown in FIG. 4. It should be noted that in the timing chart illustrated in FIG. 5, the conventional receiving circuit depicted in FIG. 12 is used as the receiving circuit.

As illustrated in FIG. 4, the transmit-timing control circuit 21 employs a minute-pulse generating circuit 211 for generating a pulsed timing signal from the transmit clock at the timing of the falling edge (or rising edge) of the transmit clock. The pulse width of this timing signal is set to a time sufficiently shorter than the period of the transmit clock.

With reference to FIG. 4, the transmit-current generating circuit 22 of FIG. 1 includes a first driver circuit 221 and a second driver circuit 222 for supplying current to the transmitting coil 10, and a logic circuit 223 for operating the first driver circuit 221 and second driver circuit 222 using the transmit data and the inverse of this data (i.e., inverted transmit data) as well as the timing signal that has been output from the minute-pulse generating circuit 211. The first driver circuit 221 includes a pMOS transistor 224 and an nMOS transistor 225 inserted in series between a power supply and ground potential, and the second driver circuit 222 includes a pMOS transistor 226 and an nMOS transistor 227 inserted in series between the power supply and ground potential. The logic circuit 223 includes an inverter INV1 which receives the transmit data and which supplies the gate of the pMOS transistor 224 with a value obtained by inverting the transmit data; a negative logical sum gate NOR1 which receives the transmit data and the output signal of the minute-pulse generating circuit 211 and which has its output connected to the gate of the nMOS transistor 225; an inverter INV2 which receives the inverted transmit data and which supplies the gate of the pMOS transistor 226 with a value obtained by inverting the inverted transmit data (namely with non-inverted transmit data); and a negative logical sum gate NOR2 which receives the inverted transmit data and the output signal of the minute-pulse generating circuit 211 and which has its output connected to the gate of the NMOS transistor 227. The logic circuit 223 is such that when the value of the binary transmit data is "1" (e.g., HIGH), the output of the inverter INV1 is LOW, the output of the negative logical sum gate NOR1 is LOW, the output of the inverter INV2 is HIGH and the output of the negative logical sum gate NOR2 is HIGH only when the output of the minute-pulse generating circuit 211 is LOW ("0") and is LOW at all other times. When the binary transmit data is "0" (LOW), on the other hand, the output of the inverter INV1 is HIGH, the output of the negative logical sum gate NOR1 is HIGH only when the output of the minute-pulse generating circuit 211 is LOW ("0") and is LOW at all other times, the output of the inverter INV2 is LOW and the output of the negative logical sum gate gate NOR2 is LOW.

In a case where the transmit data is "1" in such an arrangement, the pMOS transistor 224 of the first driver circuit 221 turns on and, because the inverted transmit data is "0", the pMOS transistor 226 of the second driver circuit 222 turns off. At this time the nMOS transistor 225 of the first driver circuit 221 is always off irrespective of the value of the timing signal, and the nMOS transistor 227 of the second driver circuit 222 turns on when the timing signal is "0" (i.e., when a LOW pulse is output from the minute-pulse generating circuit 211) and turns off when the timing signal is "1".

As illustrated in FIG. 5, therefore, if the transmit data is "1", then, when the timing signal is "0", a positive current is supplied from the pMOS transistor 224 of the first driver circuit 221 to the transmitting coil 10 in the direction toward the nMOS transistor 227 of the second driver circuit 222.

On the other hand, if the transmit data is "0", then the pMOS transistor 224 of the first driver circuit 221 turns off and, because the inverted transmit data is "1", the pMOS transistor 226 of the second driver circuit 222 turns on. At this time the nMOS transistor 227 of the second driver circuit 222 is always off irrespective of the value of the timing signal, and the NMOS transistor 225 of the first driver circuit 221 turns on when the timing signal is "0" (i.e., when a LOW pulse is output from the minute-pulse generating circuit 211) and turns off when the timing signal is "1".

As illustrated in FIG. 5, therefore, if the transmit data is "0", then, when the timing signal is "0", a negative current is supplied from the pMOS transistor 226 of the second driver circuit 222 to the transmitting coil 10 in the direction toward the nMOS transistor 225 of the first driver circuit 221.

Figure 6:
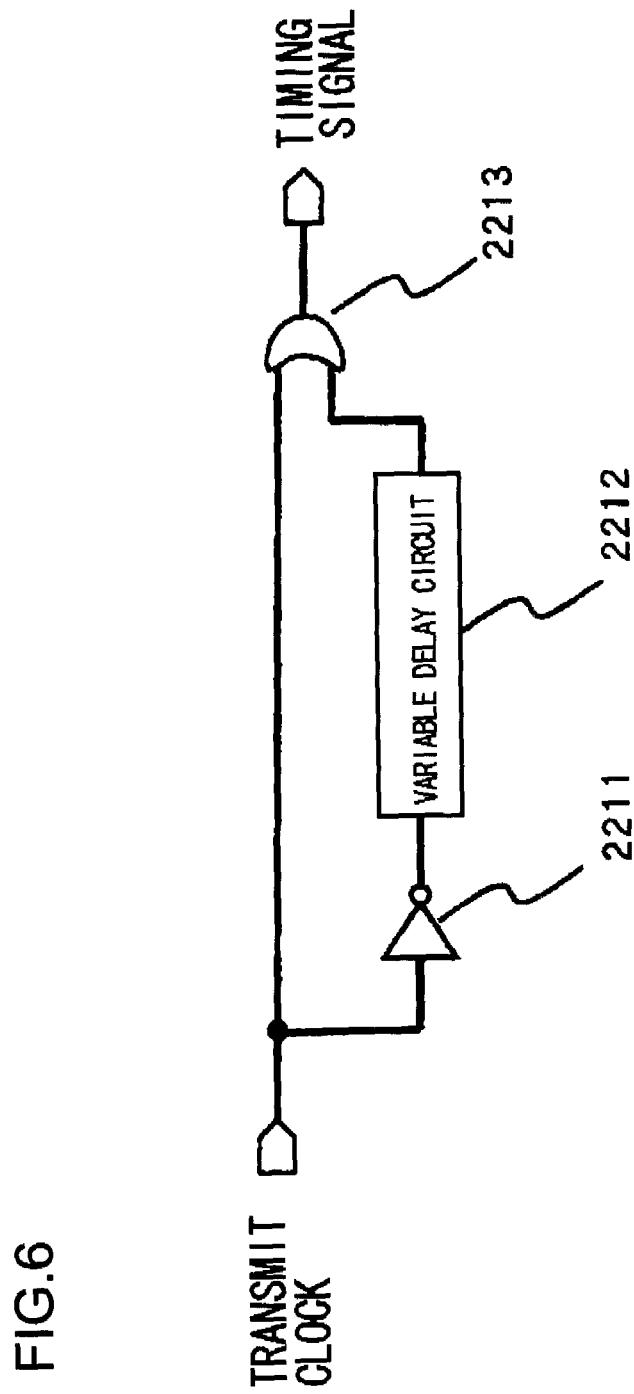
FIG. 6 is a circuit diagram illustrating an example of the configuration of a minute-pulse generating circuit shown in FIG. 4.
Figure 7:
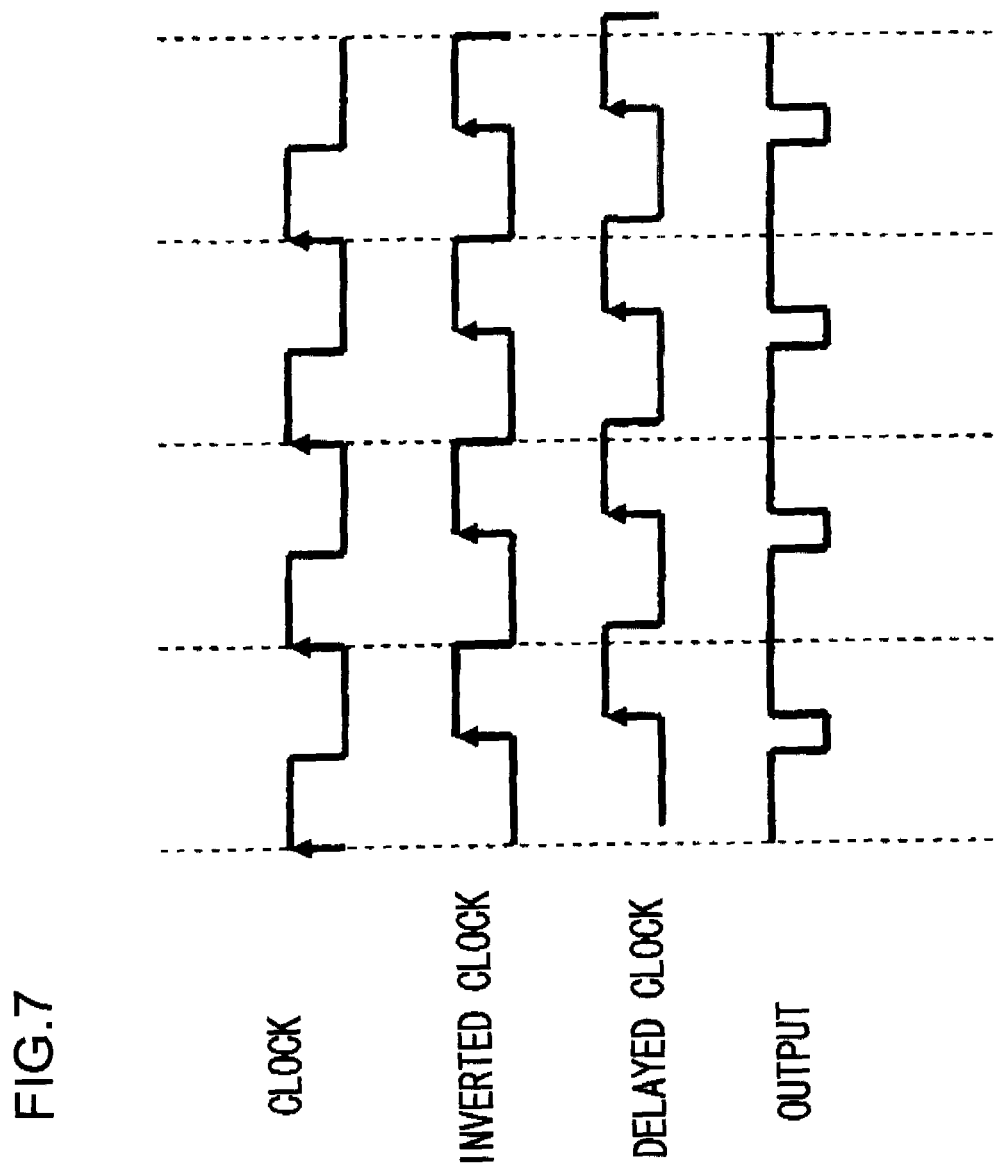
FIG. 7 is a timing chart illustrating operation of the minute-pulse generating circuit shown in FIG. 6.
Figure 8:
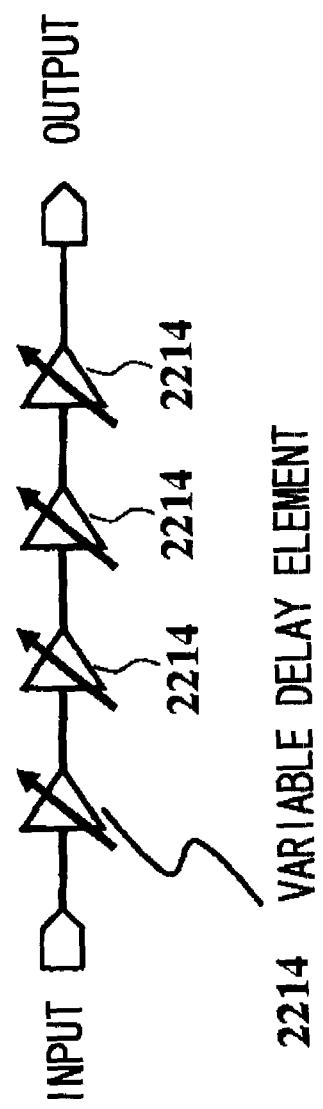
FIG. 8 is a circuit diagram illustrating the configuration of a variable delay circuit with which the minute-pulse generating circuit shown in FIG. 6 is equipped.
Figure 9:
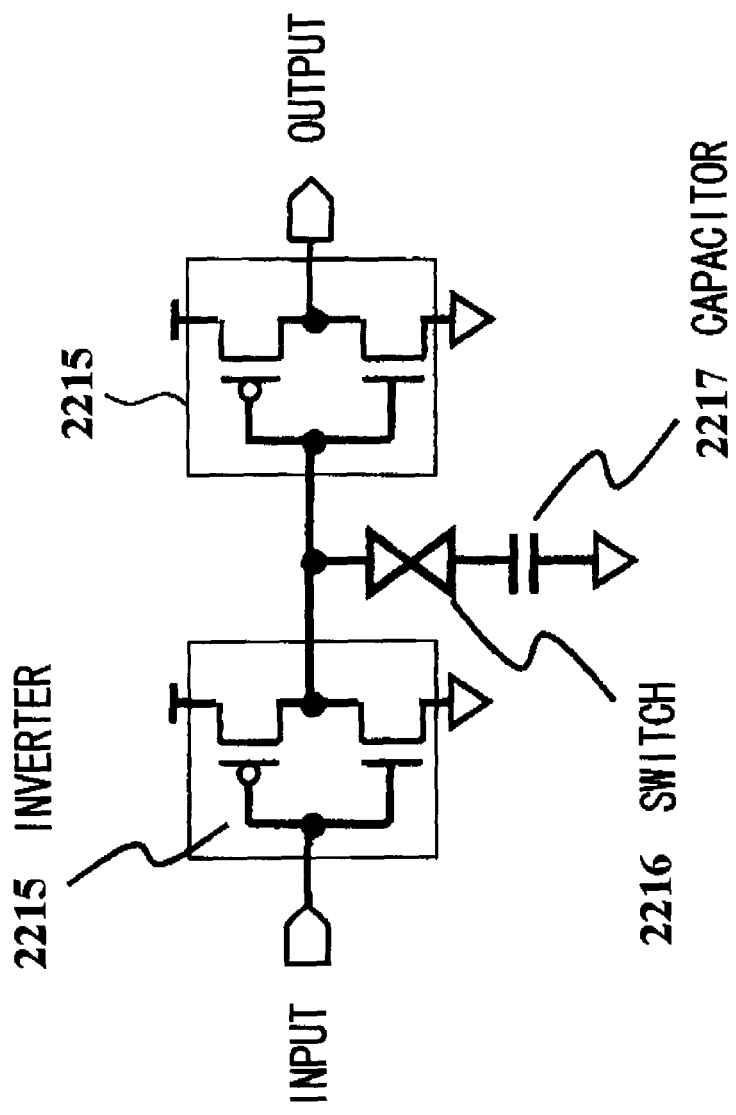
FIG. 9 is a circuit diagram illustrating an example of the configuration of a delay element with which the variable delay circuit shown in FIG. 8 is equipped.
Figure 10:
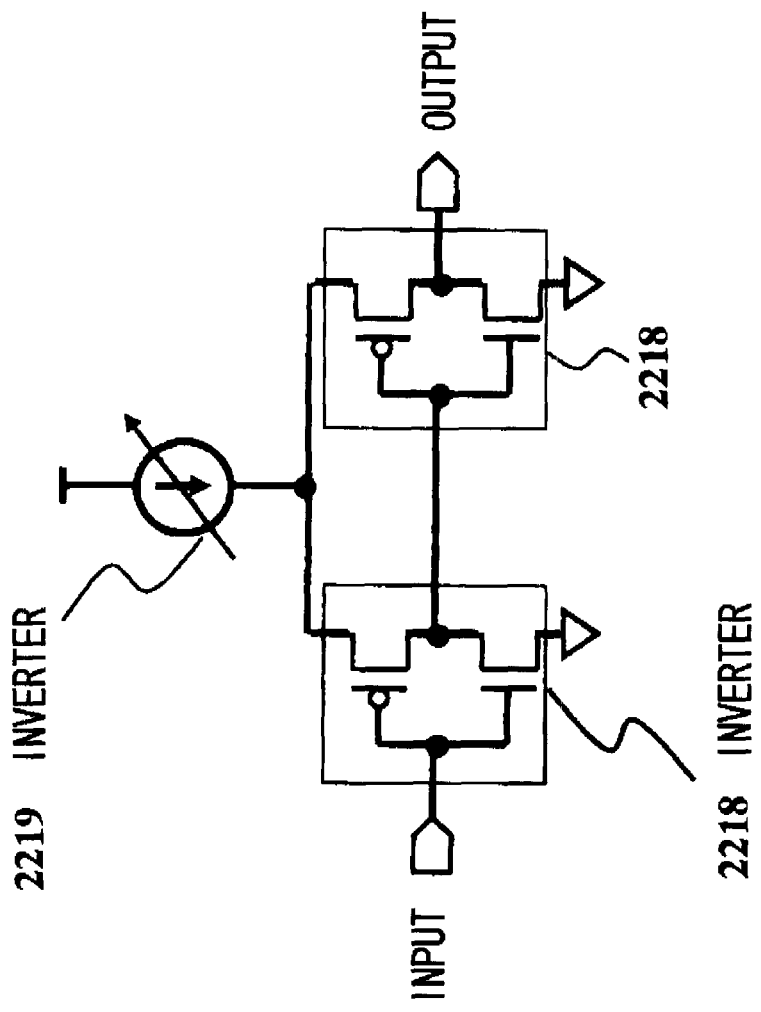
FIG. 10 is a circuit diagram illustrating another example of the configuration of a delay element with which the variable delay circuit shown in FIG. 8 is equipped.

FIG. 6 is a diagram illustrating an example of the circuit configuration of the minute-pulse generating circuit shown in FIG. 4, and FIG. 7 is a timing chart illustrating operation of the minute-pulse generating circuit shown in FIG. 6. Further, FIG. 8 is a diagram illustrating an example of the circuit configuration of a variable delay circuit with which the minute-pulse generating circuit shown in FIG. 6 is equipped, and FIGS. 9 and 10 are diagrams illustrating examples of the circuit configuration of a variable delay element with which the variable delay circuit shown in FIG. 8 is equipped.

As shown in FIG. 6, the minute-pulse generating circuit 211 includes an inverter 2211, a variable delay circuit 2212 and an logical sum gate 2213. The variable delay circuit 2212 serves as pulse-width changing means for changing the pulse width of the timing signal.

The transmit clock that has been input to the minute-pulse generating circuit 211 is branched into two signals, one of which is input to the variable delay circuit 2212 after being inverted by the inverter 2211.

The logical sum gate 2213 outputs the logical sum between the transmit clock that has been input to the minute-pulse generating circuit 211 and this transmit clock delayed by the variable delay circuit 2212. At this time the logical sum gate 2213 outputs a timing signal at every falling edge of the transmit clock, the timing signal having a pulse width corresponding to the amounts of delay of the inverter 2211 and variable delay circuit 2212, as illustrated in FIG. 7. It should be noted that in the circuit examples illustrated in FIGS. 4 and 6, an example of an arrangement is shown in which the minute-pulse generating circuit 211 outputs a "0" (LOW level) pulse in synch with the falling edge of the transmit clock, and the logic circuit 223 receives this pulse and controls the on/off operation of the nrMOS transistors 225, 227 based upon the value of the transmit data. Naturally, however, an arrangement may be adopted in which the minute-pulse generating circuit 211 outputs a "1" (HIGH level) pulse in synch with the falling edge of the transmit signal. In this case, the logical sum gate 2213 of FIG. 6 is replaced with a negative logical sum gate. Further, NOR1 of the logic circuit 223 in FIG. 4 is constituted by a circuit that turns on the nMOS transistor 225 when the transmit data is "0" and the timing signal from the minute-pulse generating circuit 211 is "1", and NOR2 is constituted by a circuit that turns on the nMOS transistor 227 when the inverted transmit data is "0" and the timing signal from the minute-pulse generating circuit 211 is "1". Alternatively, the minute-pulse generating circuit 211 may be so arranged that in response to the rising edge of the transmit clock, it generates a pulse (timing signal) having a prescribed pulse width at a prescribed timing from this rising edge.

As illustrated in FIG. 8, the variable delay circuit 2212 is composed of a plurality of serially connected variable delay elements 2214. Although FIG. 8 illustrates an example in which the variable delay circuit 2212 has four variable delay elements 2214, the number of variable delay elements is not limited to four and any number thereof may be used.

As illustrated by way of example in FIG. 9, the variable delay element 2214 can be implemented by a configuration including two serially connected inverters 2215, and a switch 2216 and capacitor 2217 inserted in series between the connection node of the two inverters 2215 and ground potential. The variable delay element 2214 shown in FIG. 9 is such that the amount of delay thereof changes in dependence upon the capacitance of the capacitor 2217. Therefore, if a plurality of the variable delay elements shown in FIG. 9 are provided, these are connected in series as shown in FIG. 8 and the capacitance values of the capacitors 2217 possessed by respective ones of the variable delay elements 2214 are set to values that are different from one another, then the amount of delay of the overall variable delay circuit 2212 can be set by turning on and off the switches 2216 possessed by the respective variable delay elements 2214.

Further, as illustrated in FIG. 10, the variable delay element 2214 can also be implemented by a configuration including two serially connected inverters 2218 and a variable current source 2219 connected between the two inverters 2218 and the power supply. With the variable delay element shown in FIG. 10, the current that flows into the two inverters 2218 is changed by controlling the amount of current that flows through the variable current source 2219. Since a pMOS transistor and nMOS transistor that construct the inverter 2218 are such that rise time or fall time at the time of on/off operation changes in dependence upon the current that flows through them, the amount of delay imposed by the variable delay element 2214 can be controlled by controlling the amount of current that flows through the variable current source 2219. Therefore, if a plurality of the variable delay elements 2214 shown in FIG. 10 are provided, these are connected in series as shown in FIG. 8 and the values of the currents that flow through the variable current sources 2219 possessed by respective ones of the variable delay elements 2214 are controlled, then the amount of delay of the overall variable delay circuit 2212 can be set to a desired value.

With the signal transmission system of the present invention, the width of the induced voltage produced by the receiving coil is dependent upon the pulse width of the timing signal generated by the minute-pulse generating circuit 221. If the pulse width of the timing signal is enlarged, therefore, then the width of the induced voltage produced by the receiving coil will also widens. Consequently, if the pulse width of the timing signal is set large by using the variable delay circuit 2212, then there is an improvement in margin with respect to a shift in timing when the induced voltage produced by the receiving coil is captured at the rising edge (or falling edge) of the receive clock. However, it should be noted that if the pulse width of the timing signal is made too large, then the time over which current flows through the transmitting coil 10 lengthens. This leads to an increase in power consumption. Accordingly, the pulse width of the timing signal should be set optimally taking into consideration the margins of these operations and the power consumed.

What is claimed is:

1. A signal transmission system for transmitting data among a plurality of semiconductor chips using a transmitting coil and a receiving coil inductively coupled to the transmitting coil, comprising:
a transmitting circuit that includes the transmitting coil and a transmit-current generating unit that includes a transmit-timing control circuit and a transmit-current generating circuit, the transmit-timing control circuit receiving a transmit clock to generate a pulse having a predetermined pulse width, at a predetermined timing from every rising edge or falling edge of the transmit clock, the pulse being supplied to the transmit-current generating circuit, as a timing signal for supplying a first current through the transmitting coil, the transmit-current generating circuit receiving the data and the timing signal to supply the first current through the transmitting coil in a direction corresponding to "1" or "0" polarity of the data during a time when the pulse of the timing signal is activated; and
a receiving circuit that includes the receiving coil and a receive-data reproducing circuit that captures voltage induced in the receiving coil due to the first current flowing through the transmitting coil, at every rising edge or falling edge of a receive clock, reproduces data transmitted and outputs the reproduced data.

2. A signal transmission system according to claim 1, wherein the timing signal comprises a pulse width which is shorter than the period of the transmit clock.

3. A signal transmission system according to claim 2, wherein the transmit-timing control circuit includes pulse-width changing means that changes the pulse width of the timing signal.

4. A semiconductor integrated circuit device comprising:
a first semiconductor chip on which the transmitting circuit set forth in claim 1 is provided; and
a second semiconductor chip stacked with the first semiconductor chip and on which the receiving circuit set forth in claim 1 is provided.

5. A transmitting circuit comprising:
a transmitting coil inductively coupled to a receiving coil to transmit data among a plurality of semiconductor chips; and
a transmit-current generating unit that includes a transmit-timing control circuit and a transmit-current generating circuit, the transmit-timing control circuit receiving a transmit clock to generate a pulse having a predetermined pulse width, at a predetermined timing from every rising edge or falling edge of the transmit clock, the pulse signal being supplied to the transmit-current generating circuit as a timing signal for supplying a first current through the transmitting coil, the transmit-current generating circuit receiving the data and the timing signal to supply the first current through the transmitting coil in a direction corresponding to "1" or "0" polarity of the data, during a time when the pulse of the timing signal is activated.

6. A transmitting circuit for performing data transmission with a receiving side using inductive coupling, the transmitting circuit comprising:
a transmit-timing control circuit that detects at least one edge of a rising edge and falling edge of a transmit clock for data transmission as an effective edge; and
a transmit-current generating circuit that exercises control in such a manner that in response to the effective edge, a current having a direction in conformity with a value of transmit data corresponding to the effective edge is supplied through a transmit inductor,
wherein the transmit-timing control circuit includes
a pulse generating circuit that receives the transmit clock and that generates a pulse signal having a prescribed pulse width when the effective edge of the transmit clock is detected; and
the transmit-current generating circuit includes:
a first driver circuit that includes first and second transistors connected between first and second power supplies, with a connection node of the first and second transistors being adopted as an output end, the output end is connected to one end of the transmit inductor;
a second driver circuit that includes third and fourth transistors connected between the first and second power supplies, with a connection node of the third and fourth transistors being adopted as an output end, the output end being connected to the other end of the transmit inductor; and
a logic circuit that receives the transmit data and output of the pulse generating circuit and that supplies output signals to respective ones of control terminals of the first to fourth transistors for controlling on/off operation of the first to fourth transistors; wherein
when the transmit data is a first logic value, the logic circuit exercises control that turns on the first transistor, turns off the second and third transistors and turns on the fourth transistor only for a period of time over which a pulse is output from the pulse generating circuit and turns off the fourth transistor at all other times; and
when the transmit data is a second logic value, the logic circuit exercises control that turns on the third transistor, turns off the first and fourth transistors and turns on the second transistor only for a period of time over which a pulse is output from the pulse generating circuit and turns off the second transistor at all other times.

7. A transmitting circuit according to claim 6, wherein one clock cycle of the transmit clock corresponds to one transmit-data time period, and the effective edge is one edge of a rising edge or falling edge of the transmit clock; and
the transmit-current generating circuit exercises control so as to supply a current having a direction in conformity with a value of transmit data corresponding to the effective edge through the transmit inductor, in response to the effective edge.

8. A semiconductor device comprising:
the transmitting circuit set forth in claim 5; and
a transmit inductor.

9. A semiconductor device comprising:
a receive inductor which is inductively coupled to the transmit inductor of the semiconductor device set forth in claim 8; and a receiving circuit that samples an induced voltage of the receive inductor, responsive to a receive clock, and reproduces data.

10. A semiconductor device according to claim 9, comprising:
a first semiconductor chip including the transmit inductor and the transmitting circuit;
a second semiconductor chip including the receive inductor and the receiving circuit;
wherein the first semiconductor chip and the second semiconductor chip construct a stacked structure.

* * * * *